(12) United States Patent
Desagulier

(10) Patent No.: US 8,481,858 B2
(45) Date of Patent: Jul. 9, 2013

(54) METHOD FOR PRODUCING A NON-DEVELOPABLE SURFACE PRINTED CIRCUIT AND THE THUS OBTAINED PRINTED CIRCUIT

(75) Inventor: Christian Desagulier, Paris (FR)

(73) Assignee: Astrium SAS, Paris (FR)

( * ) Notice: Subject to any disclaimer, the term of this patent is extended or adjusted under 35 U.S.C. 154(b) by 744 days.

(21) Appl. No.: 12/093,506

(22) PCT Filed: Oct. 24, 2006

(86) PCT No.: PCT/FR2006/002385
§ 371 (c)(1),
(2), (4) Date: May 13, 2008

(87) PCT Pub. No.: WO2007/057528
PCT Pub. Date: May 24, 2007

(65) Prior Publication Data
US 2008/0272983 A1    Nov. 6, 2008

(30) Foreign Application Priority Data
Nov. 14, 2005  (FR) ..................... 05 11502

(51) Int. Cl.
*H05K 1/00*   (2006.01)
*H05K 3/00*   (2006.01)

(52) U.S. Cl.
USPC .............. 174/250; 174/264; 29/830; 29/831

(58) Field of Classification Search
USPC ........... 29/830–831, 846–847; 430/313–319;
216/13, 36, 49–54, 100; 174/250, 255, 260–265
See application file for complete search history.

(56) References Cited

U.S. PATENT DOCUMENTS

| 3,652,332 | A | * | 3/1972 | Brand et al. ................. 427/97.4 |
| 3,905,818 | A | * | 9/1975 | Margrain ...................... 430/312 |
| 3,960,622 | A | * | 6/1976 | Hofling et al. ................. 216/19 |
| 4,440,823 | A | * | 4/1984 | Hoffmann ..................... 428/209 |
| 4,704,304 | A | * | 11/1987 | Amendola et al. ............ 427/600 |
| 4,720,324 | A | * | 1/1988 | Hayward ........................ 216/18 |
| 4,724,465 | A | * | 2/1988 | Davies ............................ 355/53 |
| 4,738,746 | A | * | 4/1988 | Clariou ........................... 216/13 |
| 5,364,493 | A | * | 11/1994 | Hunter et al. .................. 216/66 |
| 5,721,007 | A | * | 2/1998 | Lynch et al. ............. 204/192.14 |
| 6,076,723 | A | * | 6/2000 | I-Tsung Pan ................... 228/33 |
| 6,283,589 | B1 | * | 9/2001 | Gelbart ......................... 347/101 |
| 6,697,694 | B2 | * | 2/2004 | Mogensen ................... 700/119 |
| 6,884,313 | B2 | * | 4/2005 | Liu et al. ...................... 156/292 |

(Continued)

FOREIGN PATENT DOCUMENTS

DE   40 10 244    10/1991
DE   4010244    * 10/1991

(Continued)

OTHER PUBLICATIONS

International Search Report dated Mar. 30, 2007 w/ English translation.

(Continued)

*Primary Examiner* — Minh Trinh
(74) *Attorney, Agent, or Firm* — Dickinson Wright PLLC

(57) ABSTRACT

The invention relates to a method for producing a non-developable surface printed circuit and to the thus obtained printed circuit. According to the invention, each electrically conductive pattern of a printed circuit includes at least one base, which is arranged on the non-developable surface and obtained by projecting an electrically conductive varnish, and a coating, which is arranged on the base and made of an electrically well conductive material by buffer electrolysis.

5 Claims, 4 Drawing Sheets

U.S. PATENT DOCUMENTS

2003/0056366 A1* 3/2003 Peng ................................ 29/852
2004/0017408 A1* 1/2004 Cok .................................. 347/5
2004/0247842 A1 12/2004 Koyama

FOREIGN PATENT DOCUMENTS

| EP | 0 551 780 | 7/1993 |
|---|---|---|
| EP | 1 120 856 | 8/2001 |
| JP | 01 005095 | 1/1989 |

OTHER PUBLICATIONS

Patent Abstracts of Japan, vol. 014, No. 342 (C-0743), Jul. 24, 1990 & JP 02 125900 A (Kawasaki Steel Corp.), May 14, 1990.
Written Opinion of the International Searching Authority w/ English translation.

* cited by examiner

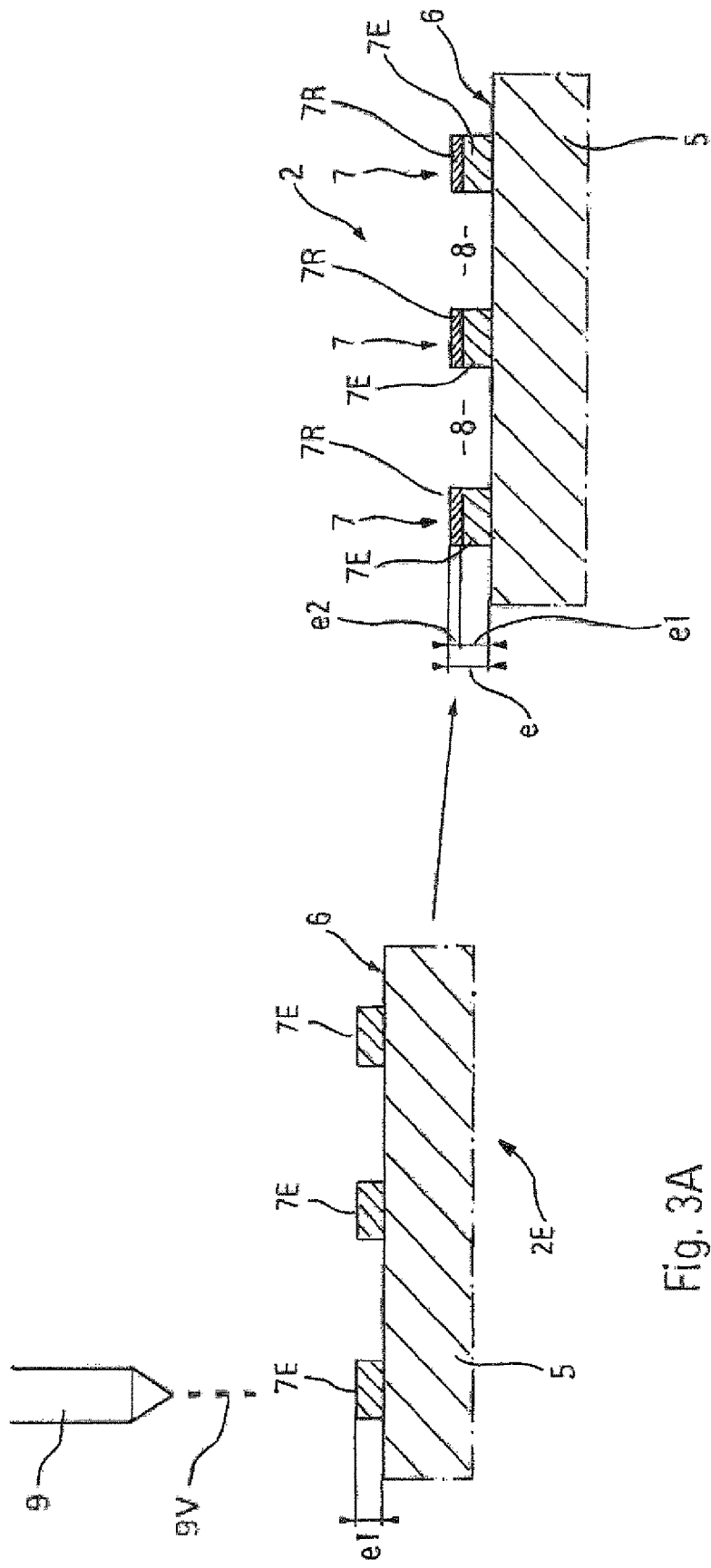

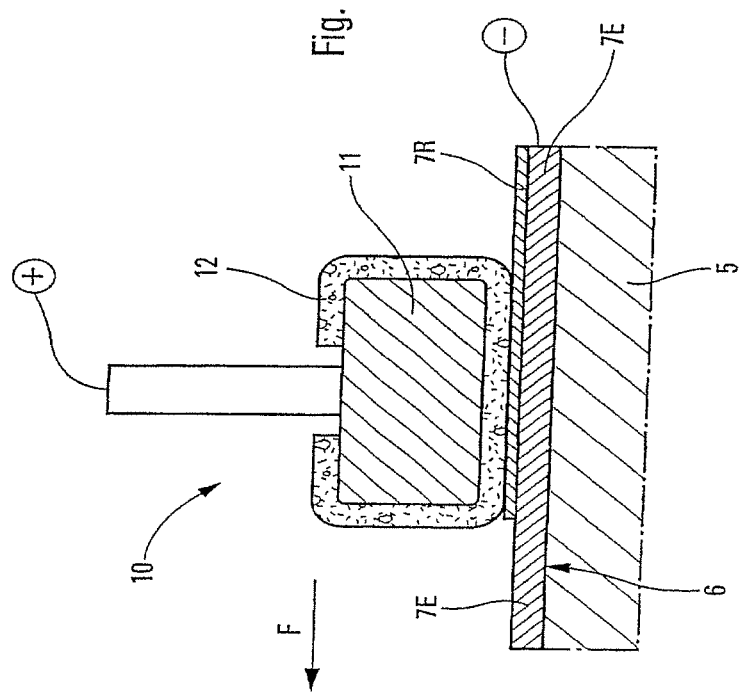

ise/METHOD FOR PRODUCING A
NON-DEVELOPABLE SURFACE PRINTED
CIRCUIT AND THE THUS OBTAINED
PRINTED CIRCUIT

TECHNICAL FIELD OF THE INVENTION

The present invention relates to a method for producing a printed circuit provided with electrically conducting patterns on a three-dimensional nondevelopable surface of its insulating substrate. It is particularly appropriate, although not exclusively so, to the production, on a surface at least approximately in the form of a paraboloid, a hyperboloid, etc., of a polarizing grid (frequency reuse antenna) or of a series of resonant patterns (dichroic antennas). The invention also relates to a printed circuit obtained by implementing this method.

BACKGROUND OF THE INVENTION

To produce precise printed circuits directly on nondevelopable three-dimensional surfaces, it is possible to use the method described in the documents U.S. Pat. No. 4,738,746, EP-0 241 331 and FR-2 596 230. This method starts with said surface, although three-dimensional nondevelopable, being uniformly covered with a layer of an electrically conductive material, which is in turn covered with a layer of a protective material. After said layers of conductive material and protective material have been formed, the outline of said patterns is mechanically traced by means of a tool cutting grooves, the depth of which is at least equal to the thickness of said protective layer, and then said layers are subjected to the action of a chemical capable of selectively etching said electrically conductive material without etching said protective material, this chemical etching operation being continued for a time long enough for said electrically conductive material to be removed over its entire thickness plumb with said grooves, after which those parts of said layer of electrically conductive material external to said patterns are separated from the substrate by peeling.

Thus, thanks to the above method, it is possible for electrically conducting patterns to be produced directly on three-dimensional nondevelopable surfaces without having to use a mask or an auxiliary substrate, with which mask or substrate it would moreover be technically difficult to obtain such precise patterns both as regards their shape and their position on said surfaces.

In such a prior method, to trace the outlines of the electrically conducting patterns, a tool provided with at least one etching tip or with at least one cutting blade is used, said tool being mounted in a machine (for example a five-axis numerical-control machine) charged with moving it relative to the nondevelopable surface.

In this way it is possible to produce devices having a nondevelopable surface bearing electrically conducting patterns in an easy and precise manner. For example, by implementing this known method it is possible to produce high-quality grid reflectors capable of working in the Ku band (11 to 18 GHz) and formed from at least one array of parallel conducting wires, these conducting wires having a width of 0.25 mm and a thickness of 35 microns and being distributed with a 1 mm pitch on a surface at least approximately in the form of a paraboloid, the opening diameter of which may be up to 2300 mm.

However, this prior method has technical and economic limitations. For example, if instead of a grid reflector intended to work in the Ku band it is desired to produce such a reflector intended for the Ka band (20 to 30 GHz), the width, the thickness and the distribution pitch of the conducting wires become much smaller (for example, 0.125 mm, 18 microns and 0.5 mm respectively) and difficulties arise due to the smaller width and smaller thickness of the conducting wires and of the inter-wire regions, namely:

the conducting pattern tracing parameters (pressure and arrangement of the etching tips or blades) and the chemical etching parameters (time) become very sensitive, thus resulting in geometrical defects and embrittlement of the conducting wires during peeling;

when tracing the conducting wires, the edge effects become significant, the tips or blades pushing back, in the manner of a plow, the thinner conducting material and reducing the adhesion of the conducting wires to the substrate; and the regions between wires are fragile and therefore liable to break during peeling.

As a result, it is necessary to ensure that the tracing by the tool is always perfect and that the execution of the method has to be slowed down, thereby increasing the costs of fabricating such a reflector.

Moreover, document DE-40 10 244 A1 teaches a method for producing a printed circuit on a three-dimensional non-developable surface. In this method, said surface is covered uniformly with a layer of an electrically conductive lacquer and then said layer is cut with a laser to the form of the printed circuit. Finally, the printed-circuit blank thus formed is metallized so as to obtain the definitive printed circuit.

Thus, the method described in document DE-40 10 244 A1 makes it possible to produce printed circuit patterns without having to mechanically cut, by contacting, a layer of electrically conductive material. However, during laser ablation of the uniform layer of electrically conductive lacquer, there is a risk of said nondevelopable surface being damaged.

SUMMARY OF THE INVENTION

The object of the present invention is to remedy the drawbacks of the methods of the prior art.

For this purpose, according to the invention, the method for producing a printed circuit comprising electrically conducting patterns on a three-dimensional nondevelopable surface of an electrically insulating substrate, each electrically conducting pattern comprising:

a base resting on said nondevelopable surface and made of an electrically conductive lacquer; and a coating resting on said base and made of a metal that is a good electrical conductor, is noteworthy in that said bases are produced by spraying a jet of said lacquer onto said nondevelopable surface by means of a movable spray head, similar to an ink-jet printing head.

Thus, thanks to the present invention, it becomes possible to produce said patterns without having to mechanically cut, by contacting or by laser, a layer of electrically conductive material, thereby eliminating the abovementioned drawbacks. Said bases of the patterns may be produced on said nondevelopable surface by means of a moderately conductive material, but allowing the blanks of said patterns to be easily sprayed, while these blanks are then used to form said coatings made of a metal of high electrical conductivity electrolytically.

It is thus possible to produce patterns of small dimensions, the bases and the coatings of which have small thicknesses.

Although the material (lacquer) of said bases may have a moderately high electrical conductivity, it must allow said coatings to be produced by electroplating. For this purpose, it is advantageous for its resistivity to be less than $30\times10^{-6}$ $\Omega\cdot$cm, preferably less than $20\times10^{-6}$ $\Omega\cdot$cm. The material of said bases may be a lacquer containing electrically conducting particles, for example metal or carbon particles.

To move said spray head relative to said nondevelopable surface and form said bases in correspondence with said corresponding patterns, it may be advantageous to use a machine similar to that mentioned above, designed to implement the prior method of document U.S. Pat. No. 4,738,746.

In order for said printed circuit according to the invention to be able to fulfill its function, the constituent material of said coatings must have a high electrical conductivity—for example, its resistivity must be less than $3\times10^{-6}$ $\Omega\cdot$cm, preferably at most $2.5\times10^{-6}$ $\Omega\cdot$cm. This material may be copper, gold, etc.

In the particular case in which the printed circuit according to the present invention is an antenna reflector working at a frequency of at least 20 GHz, the thickness of said bases may be less than 20 microns, while the thickness of said coatings may be at most 1 micron, for example 0.5 microns.

Preferably, said electrolytic coatings are deposited selectively on said bases using the pad.

To do this, a known pad electroplating tool is used, which is moved, relative to said nondevelopable surface, while remaining in contact with said bases. Here again, to move said plating tool, it may be advantageous to use a machine similar to that mentioned above, designed to implement the prior method of document U.S. Pat. No. 4,738,746.

BRIEF DESCRIPTION OF THE DRAWINGS

The figures of the appended drawing will explain how the invention may be carried out. In these figures, identical references denote similar elements.

FIGS. 3A and 3B illustrate schematically, by means of cross-sectional views in relation to FIG. 2, the method of producing the antenna reflector of FIGS. 1 and 2.

FIG. 4 illustrates schematically that step of the method of the invention relating to the selective pad electroplating of the bases of the electrically conducting patterns.

DETAILED DESCRIPTION OF THE INVENTION

Figure 1:
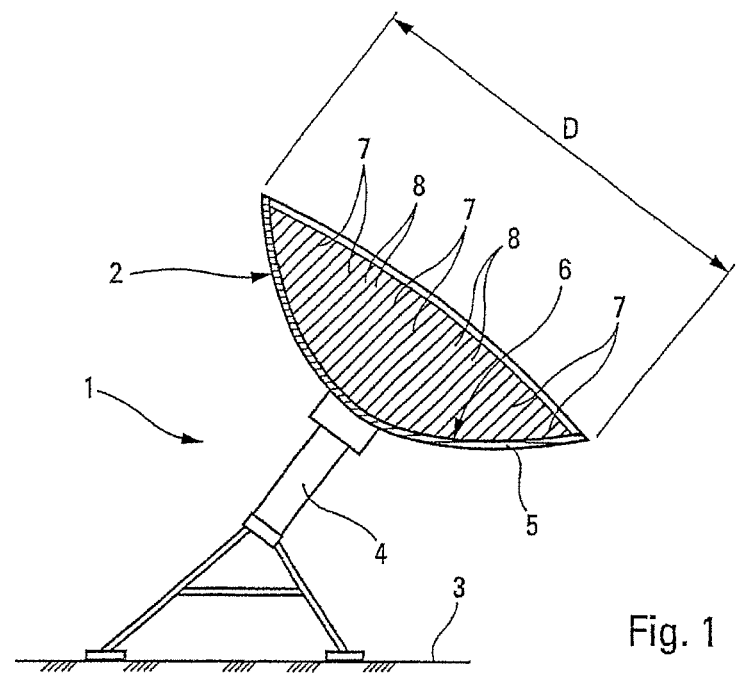
FIG. 1 shows schematically an antenna device in which the reflector (shown in diametrical section) is provided with electrically conducting patterns produced by implementing the method according to the present invention.
Figure 2:
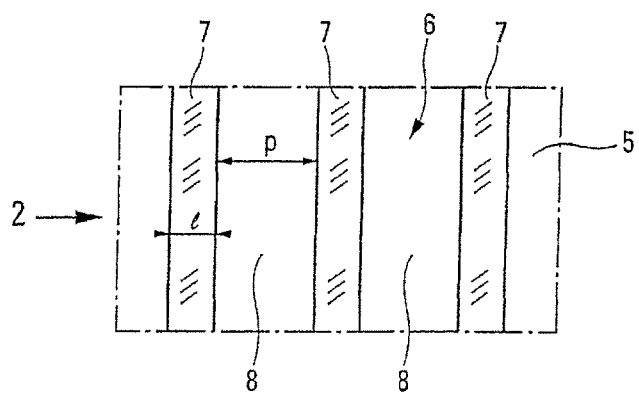
FIG. 2 is an enlarged schematic plan view of part of the reflector of FIG. 1, illustrating the shape and the arrangement of said electrically conducting patterns.

In FIGS. 2, 3A, 3B and 4, the surface of the reflector bearing the electrically conducting patterns, although concave and nondevelopable, is shown as a plane surface in order to facilitate the drawing.

FIG. 1 shows schematically an antenna device 1 provided with an antenna reflector 2 (shown in diametrical section) supported by a bearing surface 3 via a support 4.

The reflector 2 includes an electrically insulating substrate 5 (for example made of a composite), the surface 6 of which, on the opposite side from the support 4, is concave and has a nondevelopable shape, for example the at least approximate shape of a paraboloid, a hyperboloid, etc. On this three-dimensional nondevelopable surface 6, the reflector 2 bears electrically conducting patterns formed, in the example shown, by mutually parallel and equispaced conductors 7. Each conductor 7 has a rectangular cross section of width l (of the order of 0.1 mm) and a thickness e (at most equal to 20 microns) and the distribution pitch of the parallel conductors 7 is denoted by p (of the order of 0.5 mm). Thus, between two adjacent conductors 7 there is a separation region 8, in the form of a band having a width equal to p (see also FIGS. 2 and 3).

The diameter D of the opening of the reflector 2 may be around 2300 mm.

As shown in FIG. 3B, each conductor 7 is made up of a base 7E, resting on the nondevelopable surface 6, and a coating 7R, resting on said base 7E. The base 7E has a thickness e1 of around 20 microns, while the thickness e2 of the coating 7R is at most equal to 1 micron.

Figure 3C:
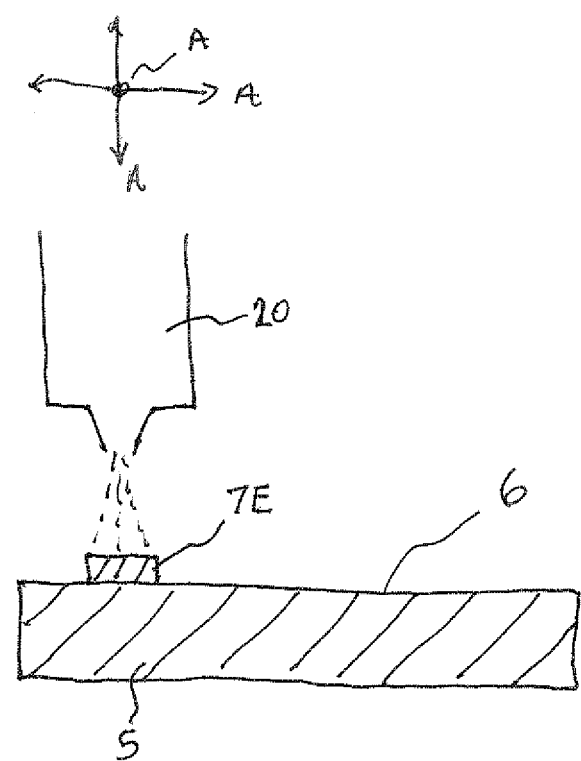
FIG. 3C shows schematically at least one base being produced by spraying a jet of lacquer onto a nondevelopable surface by a movable spray head.

To produce the reflector 2, a preliminary step illustrated schematically in FIG. 3A is firstly carried out. In this preliminary step, an electrically conductive lacquer (the resistivity of which is less than $30\times10^{-6}$ $\Omega\cdot$cm, for example less than $20\times10^{-6}$ $\Omega\cdot$cm) forming blanks of the conductors 7 is deposited on the nondevelopable surface 6 of the insulating substrate 5 by means of a movable spray head 20 similar to an ink-jet printing head as schematically illustrated in FIG. 3C, for forming a single blank, the spray head being movable in the direction of arrows A, i.e., in directions orthogonal to surface 6 and in planes parallel to surface 6, and the thickness of said blanks being equal to e1. Said blanks are intended to form the bases 7E described above.

After said preliminary step, a reflector blank 2E as shown in FIG. 3A is therefore obtained.

Next, to obtain the reflector 2 from the blank 2E, the bases 7E are electroplated so as to form coatings 7R (FIG. 3B).

To do this, the selective pad plating tool 10 of known type and shown schematically in FIG. 4, is employed. The tool 10 comprises a block 11, for example made of graphite, covered with a spongy covering 12. The block 11 is connected to a + pole (or to a − pole) to act as anode (or cathode), while the spongy covering 12 is impregnated with an electrolyte capable of depositing the metal (for example, copper, gold, etc.) that it is desired to form the coatings 7R.

As shown schematically in FIG. 4, to coat a base 7E with a coating 7R (and thus obtain a conductor 7), said base 7E is connected to a − pole (or to a + pole) and the tool 10 is moved (arrow F) relative to said base 7E, the covering 12 being in contact with the latter.

Thus, by electrolysis, the electrolyte impregnating the covering 12 deposits the coating 7R on the base 7E.

From the foregoing description, it should be pointed out that implementation of the present invention is:

economic and fast, especially because the jet printing and pad electrolysis speeds may be very high (for example 0.1 m/s) and because it is possible to use several printing heads and several electroplating tools simultaneously;

reversible, since an error in programming the machine or a printing or electroplating anomaly may be corrected, it being possible for the process to be repeated after said anomaly has been eliminated, without impairing the substrate 5;

robust, since it obviates any mechanical cutting of very fine patterns; and versatile, since it allows conducting patterns of variable shapes to be produced.

The invention claimed is:

1. A method for producing a printed circuit including electrically conducting patterns on a three-dimensional nondevelopable surface of an electrically insulating substrate, the method comprising:

producing at least one base resting on said nondevelopable surface and only made of an electrically conductive lacquer; and applying a coating that covers entirely and rests on said at least one base and made of a metal that is a good electrical conductor, wherein said at least one base is produced by spraying a jet of said lacquer onto said nondevelopable surface by a movable spray head, in such a manner that said base forms at least one blank that is sprayed by said movable spray head, and said coating is produced on said at least one base by electrolysis, wherein the electrolytic coating is deposited selectively on said at least one base using a moveable pad.

2. The method as claimed in claim 1, wherein the resistivity of said electrically conductive lacquer is less than $30 \times 10^{-6}$ $\Omega \cdot cm$.

3. The method as claimed in claim 1, wherein the resistivity of the metal constituting said coatings is less than $3 \times 10^{-6}$ $\Omega \cdot cm$.

4. A printed circuit including electrically conducting patterns on a three-dimensional nondevelopable surface of an electrically insulating substrate made according to a method comprising producing, at least one base resting on said nondevelopable surface and only made of an electrically conductive lacquer; and applying a coating that covers entirely and rests on said at least one base and made of a metal that is a good electrical conductor, wherein said at least one base is produced by spraying a jet of said lacquer onto said nondevelopable surface by a movable spray head, in such a manner that said base forms at least one blank that is sprayed by said movable spray head, and said coating is produced on said at least one base by electrolysis, wherein the electrolytic coating is deposited selectively on said at least one base using a moveable pad, and wherein the printed circuit is configured as an antenna reflector working at a frequency of at least 20 GHz, wherein a thickness of said at least one base is at most 20 microns.

5. The printed circuit as claimed in claim 4, wherein a thickness of said coatings is at most 1 micron.

\* \* \* \* \*